United States Patent [19]

Hashimoto et al.

[11] Patent Number: 5,102,688
[45] Date of Patent: Apr. 7, 1992

[54] FINE PATTERN FORMING PROCESS

[75] Inventors: Kazuhiko Hashimoto, Moriguchi; Noboru Nomura, Kyoto, both of Japan

[73] Assignee: Matsushita Electric Industrial Co., Ltd., Osaka, Japan

[21] Appl. No.: 695,327

[22] Filed: May 3, 1991

[30] Foreign Application Priority Data

May 24, 1990 [JP] Japan .................. 2-135059

[51] Int. Cl.⁵ .......................... B05D 3/06
[52] U.S. Cl. ...................... 427/43.1; 427/44; 427/96; 427/259; 427/264; 427/265; 427/379; 427/387; 427/407.1
[58] Field of Search ............. 427/43.1, 44, 96, 259, 427/264, 265, 379, 387, 407.1

Primary Examiner—Bernard Pianalto
Attorney, Agent, or Firm—Stevens, Davis, Miller & Mosher

[57] ABSTRACT

A positive type fine resist pattern can be formed at a high sensitivity at a high precision by using, as a resist film for a di-layer resist, a mixture or alternating copolymer of a silicon-containing resin and a polysulfone.

5 Claims, 3 Drawing Sheets

FINE PATTERN FORMING PROCESS

BACKGROUND OF THE INVENTION

1. Field of the Invention

The present invention relates to a fine pattern forming process employed in pattern formation by a charged beam (e.g. electron beam, focus ion beam) direct writing to obtain a semiconductor device or an integrated circuit.

2. Description of the Prior Art

In production of electronic devices such as IC, LSI, and the like, pattern formation has hitherto been conducted by photolithography using ultraviolet rays. As the pattern dimensions of these devices have become finer, it is suggested to use a stepper lens of higher numerical aperture (NA), a light source of shorter wavelength, etc., but it invites a drawback of smaller focus depth. Further, electron beam lithography has come to be used as the pattern dimension of LSI device has become finer and the production of ASIC has started.

In the fine pattern formation by electron beam lithography, a positive type electron beam resist is requisite. A polymethyl methacrylate (PMMA) is known as a positive type electron beam giving the highest resolution, but has a drawback of low sensitivity.

Therefore, there have been presented, in recent years, many reports concerning the enhancement of sensitivity of positive type electron beam resists. These reports propose positive type electron beam resists of, for example, poly(butyl methacrylate), a copolymer of methyl methacrylate and methacrylic acid, a copolymer of methacrylic acid and acrylonitrile, a copolymer of methyl methacrylate and isobutylene, polybutene-1-sulfone, poly(isopropenyl ketone) and fluoro polymethacrylate.

In all of these resists, in order to obtain a high sensitivity, an electron withdrawing group has been introduced into the side chain or an easily decomposable bond has been introduced into the principal chain to allow the principal chain to undergo easy scission by electron beam. However, they do not fully satisfy both of resolution and sensitivity. Further, they are not sufficiently good in dry etch resistance and heat resistance. Consequently, it is difficult to use them as a mask for dry etching and their usages are limited.

In recent years, there has also been provided a positive type electron beam resist obtained by adding a solution inhibitor to a novolac resin. In this resist, a solution inhibitor is added to a novolac resin (a main polymer) in order for the unexposed portions of the resist to be insoluble as highly as possible in an alkaline developer; meanwhile, in the exposed portions of the resist, the solution inhibitor is decomposed into lower molecules by the electron beam applied and thereby becomes soluble in the alkaline developer.

For example, an electron beam resist has been presented which is obtained by adding poly(methyl pentene sulfone) to a novolac resin. This resist is easily dry-etchable because it contains a novolac resin, and is highly sensitive because the polysulfone is decomposed. The resist, however, has poor resolution, and the unexposed portions are soluble in an alkaline developer to some extent, making it impossible to obtain a sufficient remaining film thickness and giving a large dimensional change in development. Thus, the resist is not practical.

Further, the electron beam lithography has various drawbacks such as poor dry etch resistance and heat resistance of electron beam resists, an adverse effect of proximate effect caused by forward or backward scattering of electron on pattern precision, an adverse effect of charging by incident electrons on pattern writing, and the like.

In order to improve these drawbacks, use of a multi-layer resist consisting of a pattern forming layer and a planarizing layer is very effective. FIGS. 4A to 4D are illustrations explaining a process for forming a multi-layer resist by electron beam lithography. In order to expect a reduced proximate effect, a high-molecular organic film as a bottom layer 31 is formed on a substrate 11 in a thickness of 2-3 $\mu$m and then a heat treatment is effected (FIG. 4A). Thereon is formed, as an intermediate layer 32, an inorganic film of $SiO_2$ or the like or an inorganic high-molecular film of SOG (spin on glass) or the like in a thickness of 0.2 $\mu$m. Thereon is formed, as a top layer 33, an electron beam resist in a thickness of 0.5 $\mu$m (FIG. 4B). Then, electron beam writing is effected, followed by development, to obtain a resist pattern 33P (FIG. 4C). Thereafter, the intermediate layer is dry-etched using the resist pattern as a mask, after which the bottom layer is dry-etched using the intermediate layer as a mask (FIG. 4D). By employing the above process using a multi-layer resist, a fine pattern can be formed at a high aspect ratio. However, in the process using a tri-layer resist, the steps are more complex; contamination is higher; dimensional change in pattern transfer is larger; thus, the process using a tri-layer resist is not practical.

As shown in FIG. 5, in the conventional process using a tri-layer resist, it occurs in some cases that a width of 0.5 $\mu$m in design pattern 100 becomes thinner to about 0.3 $\mu$m after the bottom layer is etched.

As mentioned above, the process using a trilayer resist is effective, but has various drawbacks such as complex steps, contamination, change in resist dimension during pattern transfer, and the like.

In electron beam writing, the adverse effect of proximate effect on pattern precision makes it necessary to form a bottom layer in a large thickness. Hence, there have been developed a silicon resist, an inorganic resist, etc., all of which function as a mask for the bottom layer and also as a resist layer. These resists include a resist containing a siloxane bond in the principal chain, a rudder type polysiloxane, a chalcogenide glass type inorganic resist, etc.; however, they are far from practical application because they have insufficient dry etch resistance, poor sensitivity and poor resolution. Further, these resists, since using an organic solvent as a developer, are large in variations of resist sensitivity and dimension, are low in process latitude, and have a fear of environmental pollution.

In order to solve these problems, the present inventors have completed an electron beam resist which can be developed with an aqueous organic alkali solution and which has high dry etch resistance, high sensitivity and high resolution, as well as a process for forming a fine pattern using said resist.

SUMMARY OF THE INVENTION

An object of the present invention is to provide a process which can form a fine resist pattern easily at a high precision using a multi-layer resist and direct writing by a charged beam (e.g. electron beam, focus ion beam).

In order to achieve the above object, the present invention provides a process for forming a fine pattern, which comprises:

a step of forming a high-molecular organic film on a semiconductor substrate, followed by a heat treatment, a step of forming, on the high-molecular organic film, a resist film comprising a mixture or alternating copolymer of a silicon-containing resin and a polysulfone, followed by a heat treatment, a step of irradiating the resulting resist film with a charged beam to write a pattern, followed by development to form a resist pattern, and a step of etching the high-molecular organic film using the resist pattern as a mask.

The present invention also provides a process for forming a fine pattern, which uses a resist comprising a mixture of a polysiloxane of high dry etch resistance having a Si-O bond in the principal chain and a polysulfone which is decomposed upon irradiation with an electron beam.

The present invention also provides a process for forming a fine pattern, which uses a resist comprising an alternating copolymer of the above polysiloxane and the above polysulfone.

The present invention also provides a process for forming a fine pattern, which uses a resist comprising a mixture of a polysilane of high dry etch resistance having a Si-Si bond in the principal chain and a polysulfone which is decomposed upon irradiation with electron beam.

The present invention also provides a process for forming a fine pattern, which uses a resist comprising an alternating copolymer of the above polysilane and the above polysulfone.

DESCRIPTION OF THE PREFERRED EMBODIMENTS

The present invention solves the above-mentioned problems by using, as an electron beam resist, a mixture or alternating copolymer, preferably the latter, of a polysilicon of high dry etch resistance and a polysulfone which is decomposed upon irradiation with a charged beam.

The silicon-containing resin includes a polysiloxane, which has a Si-O bond in the principal chain, a polysilane, which has a Si-Si bond in the principal chain, etc.

As the polysulfone, there is used the polysulfone which is decomposed upon irradiation with a charged beam.

When the resist film is exposed to an electron beam, the polysulfone having a higher sensitivity than the silicon-containing resin is decomposed, at the exposed portions, into a lower molecule which has no function as a solution inhibitor and, as a result, the exposed portions become soluble in a developer.

Figure 1:
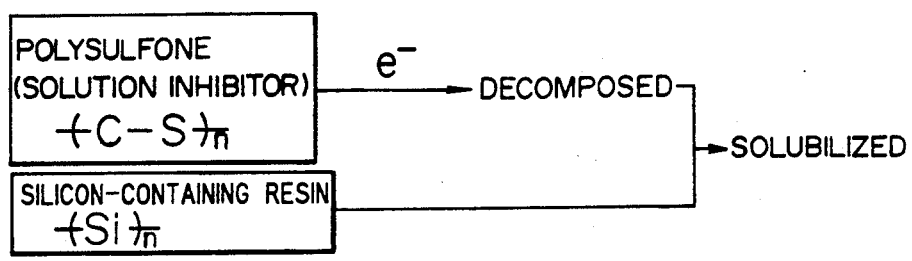
FIG. 1 is an illustration showing a mechanism of chemical change which the resist materials used in the present invention undergo when irradiated with a charged beam.

Meanwhile, the unexposed portions of the resist film have no solubility in any developer because the polysulfone functions as a solution inhibitor, making it possible to obtain a sufficient resin film thickness. Thus, the resist of the present invention functions as a satisfactory positive type electron beam resist (FIG. 1).

Since the electron beam resist of the present invention contains silicon atoms of high dry etch resistance, it can become a silicon-containing electron beam resist for di-layer resist. That is, the resist of the present invention consists of two components, one being a polysulfone which has a C-S bond easily decomposed by an electron beam and accordingly is decomposed by an electron beam into a lower molecule soluble in a developer, and the other being a silicon-containing resin of high dry etch resistance; therefore, the resist is silicon-containing electron beam resist having a high sensitivity to an electron beam.

By using the electron beam resist of the present invention, as a top layer resist for the di-layer resist, there can be easily formed a multi-layer resist which has sufficiently high dry etch resistance and high sensitivity and which enables use of an aqueous organic alkali solution as a developer; consequently, a positive type fine resist pattern can be formed easily and precisely without giving any adverse effect on environment and human health.

The present invention is hereinafter described by way of Examples. However, the present invention is in no way restricted to these Examples.

EXAMPLE 1

1.0 g of a poly(ethyl pentene sulfone) having a molecular weight of about 50,000 was dissolved in 100 ml of ethyl cellosolve acetate. Thereto was added 1.0 g of a polydimethyl siloxane having a molecular weight of about 100,000 to obtain a mixture. The mixture was stirred gently at 25° C. for 5 minutes and filtered to remove insolubles to obtain a uniform solution. This resist solution was dropped on a semiconductor substrate to effect spin coating at 2,000 rpm for 2 minutes. The resulting substrate was baked at 90° C. for 20 minutes to form a resist film of 1.2 $\mu$m in thickness. Then, electron beam writing was applied onto the resist film at an accelerating voltage of 30 kV at a dose of $1 \times 10^{-5}$ C/cm$^2$. Thereafter, development was effected with an aqueous organic alkali solution for 2 minutes, whereby the exposed portions of the resist film were dissolved but the unexposed portions were not soluble at all. As a result, a positive type fine resist pattern was formed precisely.

EXAMPLE 2

A resist film was formed in the same manner as in Example 1 except that the polydimethyl siloxane used in Example 1 was replaced by polyethylsiloxane. Electron beam writing was applied onto the resist film at an accelerating voltage of 20 kV at a dose of 10 $\mu$C/cm$^2$. Thereafter, development was effected with an aqueous organic alkali solution for 2 minutes, whereby a positive type fine resist pattern was formed precisely. There was little thinning in the unexposed portions of the resist film.

EXAMPLE 3

Figure 2A:
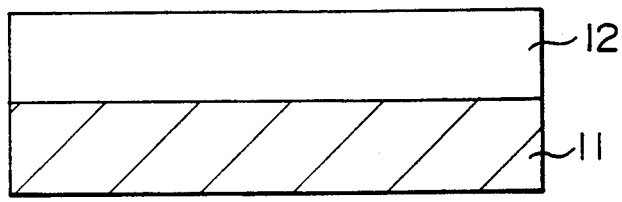
FIGS. 2A to 2D are sectional views showing an example of the steps of the pattern forming process of the present invention.
Figure 2B:
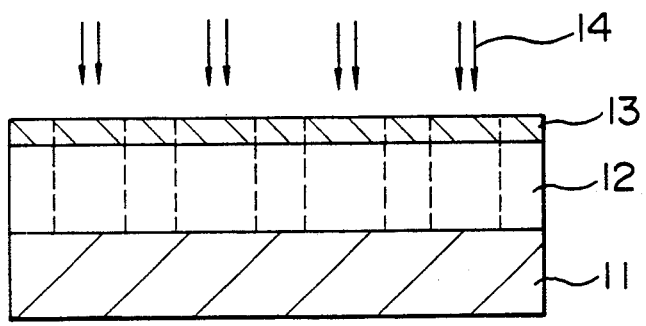
Figure 2C:
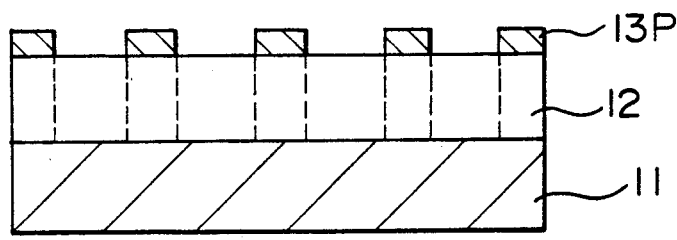
Figure 2D:
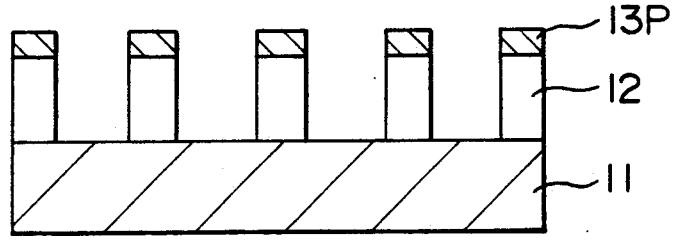

The third example of the present invention is shown in FIGS. 2A to 2D. A high-molecular organic film was formed as a bottom layer film 12 on a semiconductor substrate 11 in a thickness of 2 μm and baked at 200° C. for 20 minutes (FIG. 2A). Thereon was applied the resist solution obtained in Example 1, as a top layer resist 13, and baking was effected at 90° C. for 20 minutes to form a resist film of 0.5 μm in thickness (FIG. 2B). Then, electron beam writing was applied at an accelerating voltage of 30 kV at a dose of 5 μC/cm$^2$, after which development was effected for 2 minutes with an aqueous organic alkali solution to obtain a positive type fine resist pattern 13P of 0.3 μm line and space precisely (FIG. 2C). Etching of the bottom layer film 12 was effected using the resist pattern 13P as a mask, to obtain a vertical fine resist pattern of 0.3 μm line and space precisely with no dimensional change (FIG. 2D). Thus, by using a silicon-containing resist of high sensitivity as a top layer resist for a di-layer resist, a positive type fine resist pattern can be formed at a high precision.

EXAMPLE 4

0.2 g of ethyl pentene sulfone was dissolved in 100 ml of cellosolve acetate. Thereto was added 0.1 g of dimethyl siloxane. The mixture was subjected to polymerization using an azo bis type polymerization initiator, to obtain an alternating copolymer. The copolymer solution was stirred gently at 25° C. for 5 minutes and filtered to remove insolubles to obtain a uniform solution. This resist solution was dropped on a semiconductor substrate to effect spin coating at 2,000 rpm for 2 minutes. The resulting substrate was baked at 90° C. for 20 minutes to form a resist film of 1.2 μm in thickness. Then, electron beam writing was applied at an accelerating voltage of 30 kV at a dose of $1 \times 10^5$ C/cm$^2$. Thereafter, development was effected with an aqueous organic alkali solution for 2 minutes. The unexposed portions of the resist film were not soluble and a positive type fine resist pattern was obtained precisely.

EXAMPLE 5

Figure 3A:
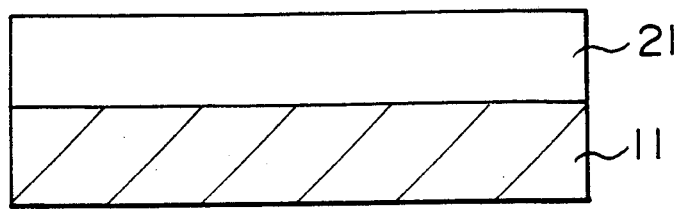
FIGS. 3A to 3D are sectional views showing other example of the steps of the pattern forming process of the present invention.
Figure 3B:
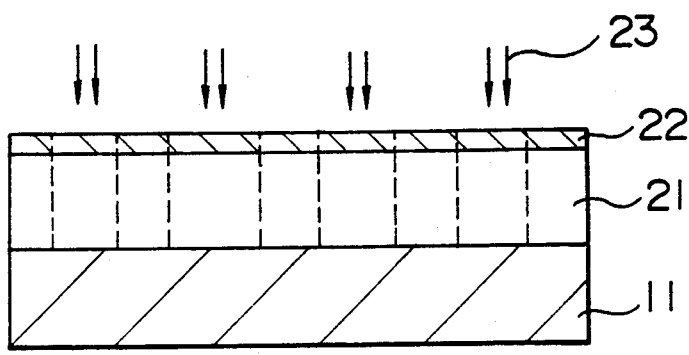
Figure 3C:
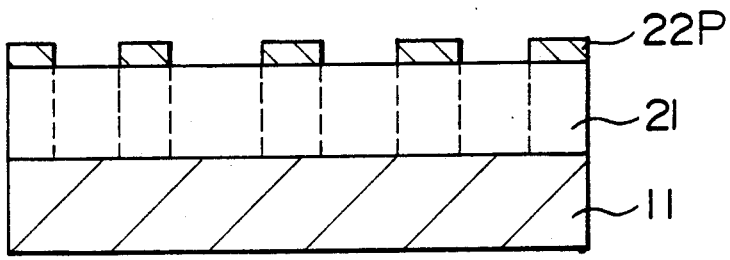
Figure 3D:
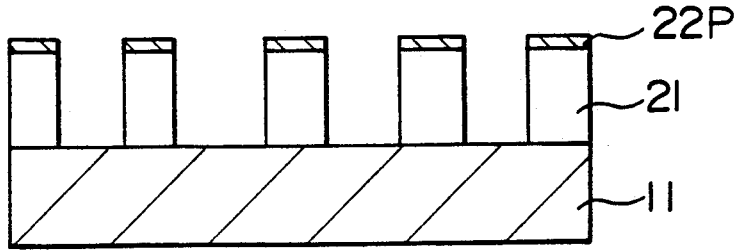
Figure 4A:
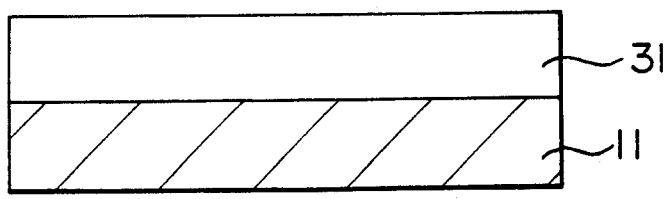
FIGS. 4A to 4D are sectional views showing the steps of the conventional pattern forming process using a multi-layer resist.
Figure 4B:
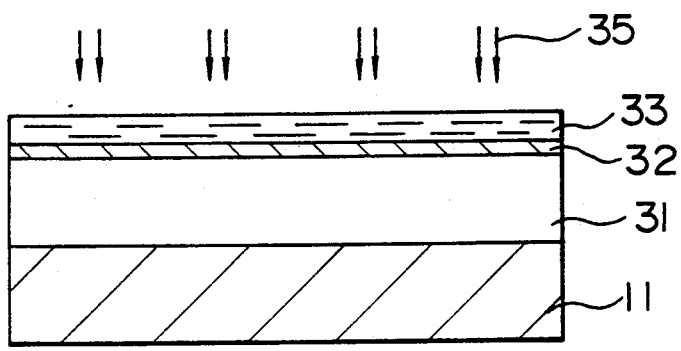
Figure 4C:
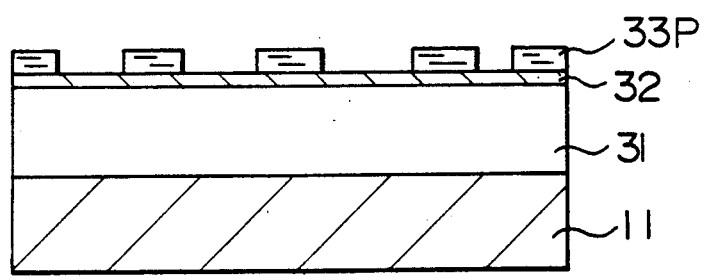
Figure 4D:
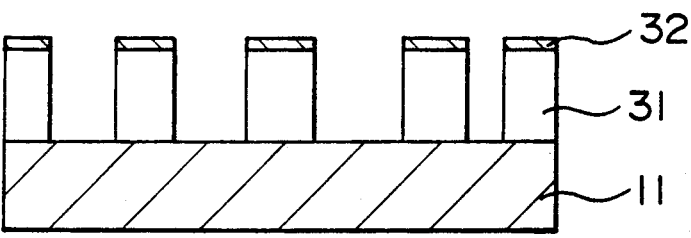
Figure 5:
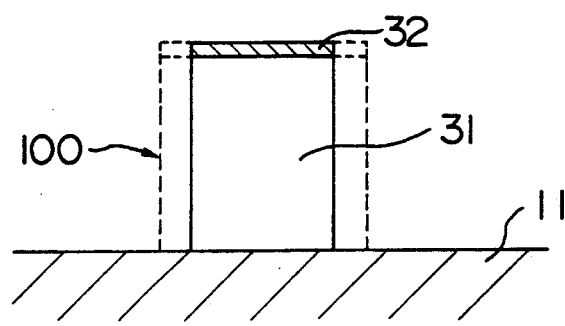
FIG. 5 is a sectional view showing an example of the dimensional change of pattern in the conventional pattern forming process using a multi-layer resist.

The fifth example of the present invention is shown in FIGS. 3A-3D. A high-molecular organic film was formed as a bottom layer film 21 on a semiconductor substrate 11 in a thickness of 2 μm, and baking was effected at 220° C. for 20 minutes (FIG. 3A). Thereon was applied the copolymer solution obtained in Example 4, as a top layer resist 22, and baking was effected at 90° C. for 20 minutes to form a resist film of 0.5 μm in thickness (FIG. 3B). Then, electron beam writing was applied at an accelerating voltage of 20 kV at a dose of $5 \times 10^{-6}$ C/cm$^2$. Thereafter, development was effected with an aqueous organic alkali solution for 2 minutes to form a positive type fine resist pattern 22P precisely (FIG. 3C). Etching of the bottom layer film 21 was effected using the resist pattern 22P as a mask to obtain a vertical fine resist pattern precisely (FIG. 3D). Thus, by using a silicon-containing resist of high sensitivity as a top layer resist for a di-layer resist, a positive type fine resist pattern can be formed precisely.

EXAMPLE 6

1.0 g of a poly(ethyl pentene sulfone) having a molecular weight of about 50,000 was dissolved in 100 ml of ethyl cellosolve acetate. Thereto was added 1.0 g of a poly(dimethyl silane) to prepare a mixture. The mixture was gently stirred at 25° C. for 5 minutes and filtered to remove insolubles to obtain a uniform solution. This resist solution was dropped on a semiconductor substrate and spin coating was effected at 2,000 rpm for 2 minutes. The resulting substrate was baked at 90° C. for 20 minutes to form a resist film of 1.2 μm in thickness. Then, electron beam writing was applied at an accelerating voltage of 30 kV at a dose of $1 \times 10^{-5}$ C/cm$^2$. Thereafter, development was effected with an aqueous organic alkali solution for 2 minutes, whereby the exposed portions of the resist were dissolved but the unexposed portions were not soluble at all. As a result, a positive type fine resist pattern was formed precisely.

EXAMPLE 7

A resist film was formed in the same manner as in Example 6 except that the polydimethyl silane used in Example 6 was replaced by polyethylsilane. To this resist film was applied electron beam writing at an accelerating voltage of 20 kV at a dose of 10 μC/cm$^2$. Then, development was effected with an aqueous organic alkali solution for 2 minutes to form a positive type fine resist pattern precisely. There was little thinning in the unexposed portions of the resist film.

EXAMPLE 8

A high-molecular organic film was formed as a bottom layer film on a semiconductor substrate in a thickness of 2 μm, and baked at 200° C. for 20 minutes. Thereon was applied the uniform solution obtained in Example 6, as a top layer resist, and baking was effected at 90° C. for 20 minutes to form a resist film of 0.5 μm in thickness. Then, electron beam writing was applied at an accelerating voltage of 30 kV at a dose of 5 μC/cm$^2$. Thereafter, development was effected with an aqueous organic alkali solution for 2 minutes to obtain a positive type fine resist pattern precisely. Etching of the bottom layer film was effected using the resist pattern as a mask to obtain a vertical fine resist pattern precisely. Thus, by using a silicon-containing resist of high sensitivity as a top layer resist for a di-layer resist, a positive type fine resist pattern can be formed precisely.

EXAMPLE 9

0.2 g of ethyl pentene sulfone was dissolved in 100 ml of cellosolve acetate. Thereto was added 0.1 g of dimethyl silane to prepare a mixture, and the mixture was subjected to polymerization using an azo bis type polymerization initiator to form an alternating copolymer. The copolymer solution was gently stirred at 25° C. for 5 minutes and filtered to remove insolubles to obtain a uniform solution. This resist solution was dropped on a semiconductor substrate, and spin coating was effected at 2,000 rpm for 2 minutes. The resulting substrate was baked at 90° C. for 20 minutes to form a resist film of 1.2 μm in thickness. Then, electron beam writing was applied at an accelerating voltage of 30 kV at a dose of $1 \times 10^{-5}$ C/cm$^2$. Thereafter, development was effected with an aqueous organic alkali solution for 2 minutes, whereby the unexposed portions of the resist were not soluble at all and a positive type fine resist pattern was obtained precisely.

EXAMPLE 10

A high-molecular organic film was formed as a bottom layer film on a semiconductor substrate in a thickness of 2 μm, and baking was effected at 220° C. for 20 minutes. Thereon was applied the copolymer solution obtained in Example 9, as a top layer resist, and baking was effected at 90° C. for 20 minutes to form a resist film of 0.5 μm in thickness. Then, electron beam writing was applied at an accelerating voltage of 20 kV at a dose of $5 \times 10^{-6}$ C/cm$^2$. Thereafter, development was effected with an aqueous organic alkali solution for 2 minutes to obtain a positive type fine resist pattern precisely. Etching of the bottom layer film was effected using the resist pattern as a mask to obtain a vertical fine resist pattern precisely. Thus, by using a silicon-containing resist of high sensitivity as a top layer resist for a di-layer resist, a positive type fine resist pattern can be formed precisely.

In the present invention, a fine pattern can be formed easily and precisely by using the above-mentioned silicon-containing electron beam resist and a pattern forming process using the resist. Since the resist contains silicon atoms of high dry etch resistance, there occurs no dimensional change during pattern transfer; the process steps are simple; the sensitivity is high; the process latitude is wide because an aqueous alkali solution is used as a developer; as a result, a fine resist pattern can be formed precisely. Therefore, the present invention enables precise formation of a fine pattern of high resolution.

As described above, in the present invention, a di-layer resist can be formed easily by using, as an electron beam resist, a mixture of a polysulfone type polymer and a silicon-containing resist, and a positive type resist pattern of high resolution and high dry etch resistance can be formed therefrom at a high sensitivity using an aqueous organic alkali solution as a developer. A di-layer resist can also be formed easily by using, as an electron beam resist, a copolymer of a polysulfone easily decomposable by a charged beam and a silicon-containing resist of high dry etch resistance, and a vertical fine resist pattern can be formed therefrom precisely, thus greatly contributing to the production of ultra large-scaled integrated circuits.

What is claimed is:

1. A process for forming a fine pattern, which comprises:
   a step of forming a high-molecular organic film on a semiconductor substrate, followed by a heat treatment,
   a step of forming, on the high-molecular organic film, a resist film comprising any one selected from the group consisting of a mixture of a silicon-containing resin and a polysulfone which is decomposed upon irradiation with a charged beam and an alternating copolymer of a silicon-containing resin and a polysulfone which is decomposed upon irradiation with a charged beam, followed by a heat treatment,
   a step of irradiating the resulting resist film with a charged beam to write a pattern, followed by development to form a resist pattern, and
   a step of etching the high-molecular organic film using the resist pattern as a mask.

2. A process according to claim 1, wherein said silicon-containing resin is polysiloxane and said resist film comprises the mixture of the polysiloxane and the polysulfone.

3. A process according to claim 1, wherein said silicon-containing resin is polysiloxane and said resist film comprises the alternating copolymer of the polysiloxane and the polysulfone.

4. A process according to claim 1, wherein said silicon-containing resin is polysilane and said resist film comprises the mixture of the polysilane and the polysulfone.

5. A process according to claim 1, wherein said silicon-containing resin is polysilane and said resist film comprises the alternating copolymer of the polysilane and the polysulfone.

* * * * *